United States Patent [19]

Mu et al.

[11] Patent Number: 5,612,254
[45] Date of Patent: Mar. 18, 1997

[54] METHODS OF FORMING AN INTERCONNECT ON A SEMICONDUCTOR SUBSTRATE

[75] Inventors: Xiao-Chun Mu, Saratoga; Srinivasan Sivaram, San Jose; Donald S. Gardner, Mountain View; David B. Fraser, Danville, all of Calif.

[73] Assignee: Intel Corporation, Santa Clara, Calif.

[21] Appl. No.: 905,473

[22] Filed: Jun. 29, 1992

[51] Int. Cl.⁶ .................................................. H01L 21/44
[52] U.S. Cl. .......................... 437/195; 437/225; 437/228; 437/190; 156/636.1
[58] Field of Search .................................. 437/195, 225, 437/228, 192, 194, 190, 200, 229; 148/DIG. 43; 257/758, 760; 156/636.1

[56] References Cited

U.S. PATENT DOCUMENTS

| | | |
|---|---|---|
| 3,844,831 | 10/1974 | Cass et al. . |
| 4,242,698 | 12/1980 | Ghate et al. . |
| 4,367,119 | 1/1983 | Logan et al. . |
| 4,386,116 | 5/1983 | Nair et al. . |
| 4,600,624 | 7/1986 | Joseph et al. . |
| 4,789,648 | 12/1988 | Chow et al. . |
| 4,792,534 | 12/1988 | Tsuji et al. . |
| 4,808,552 | 2/1989 | Anderson ................. 437/187 |
| 4,944,836 | 7/1990 | Beyer et al. . |
| 4,948,755 | 8/1990 | Mo . |
| 4,956,313 | 9/1990 | Cote et al. ................. 437/203 |
| 4,992,135 | 2/1991 | Doan . |
| 5,000,818 | 3/1991 | Thomas et al. . |
| 5,010,039 | 4/1991 | Ku et al. . |
| 5,055,908 | 10/1991 | Fuller et al. ................. 357/71 |
| 5,117,276 | 5/1992 | Thomas et al. . |
| 5,122,859 | 6/1992 | Coleman, Jr. ................. 357/71 |
| 5,209,817 | 5/1993 | Ahmad et al. . |
| 5,219,787 | 6/1993 | Carey et al. . |
| 5,244,837 | 9/1993 | Dennison ................. 437/195 |
| 5,277,985 | 1/1994 | Li et al. . |
| 5,300,813 | 4/1994 | Joshi et al. ................. 257/752 |
| 5,308,796 | 5/1994 | Feldman et al. . |
| 5,310,602 | 5/1994 | Li et al. . |

FOREIGN PATENT DOCUMENTS

| | | |
|---|---|---|
| 2211023 | 6/1989 | United Kingdom . |
| 9110261 | 12/1990 | WIPO . |

OTHER PUBLICATIONS

E.K. Broadbent, et al "High–Density High–Reliability Tungsten Interconnect" IEEE Trans. Electron. Dev. 35(7) Jul. 1988 pp. 952–956.

(List continued on next page.)

*Primary Examiner*—George Fourson
*Assistant Examiner*—C. Everhart
*Attorney, Agent, or Firm*—Blakely, Sokoloff, Taylor & Zafman

[57] ABSTRACT

A device and methods of forming an interconnection within a prepatterned channel in a semiconductor device are described. The present invention includes a method of forming an interconnect channel within a semiconductor device. A first dielectric layer is deposited over a substrate and patterned to form a contact opening that is subsequently filled with a contact plug. A second dielectric layer is deposited over the patterned first dielectric layer and the contact plug. The second dielectric layer is patterned to form the interconnect channel, wherein the first dielectric layer acts as an etch stop to prevent etching of the substrate. The present invention also includes a method of forming an interconnect. A dielectric layer is deposited over a substrate and patterned to form an interconnect chapel. A metal layer is deposited over the patterned dielectric layer and within the interconnect channel. The metal layer is polished with an alkaline solution to remove the metal layer that does not lie within the interconnect chapel to form an interconnect. The present invention further includes a method of forming an interconnect over a silicon nitride layer. The silicon nitride layer is deposited over a semiconductor substrate and patterned to form a contact opening that is subsequently filled with a conductive material. A metal layer is deposited on the patterned silicon nitride layer and the contact plug and patterned to form the interconnect such that all of the interconnect lies on the contact plug and part of the patterned silicon nitride layer.

22 Claims, 5 Drawing Sheets

OTHER PUBLICATIONS

J.J. Estabil et al. "Electromigration Improvements with Titanium Underlay and Overlay in Al(Cu) Metallurgy" Proc. Eighth IEEE VLSI Conf. (Jun. 1991).

Pai–Lin Pai, et al "Selective Electroless Copper for VLSI Interconnection" IEEE Electron. Dev. Lett. 10(9) Sep. 1989 pp. 423–425.

"Process and Structure for Improved Electromigration Resistance," *IBM Technical Disclosure Bulletin*, vol. 32, No. 10B, pp. 112–113 (Mar. 1990).

"Lithographic Patterns with a Barrier Liner," *IBM Technical Disclosure Bulletin*, vol. 32, No. 10B, pp. 114–115 (Mar. 1990).

"High Stud–to–Line Contact Area in Damascene Metal Processing," *IBM Technical Disclosure Bulletin*, vol. 33, No. 1A, pp. 160–161 (Jun. 1990).

"Technique to Fabricate Co–Planar Conductors in a Dielectric Layer," *IBM Technical Disclosure Bulletin*, vol. 33, No. 2, pp. 258–259 (Jul. 1990).

"Damascene Electromigration Resistant Stud Contact," *IBM Technical Disclosure Bulletin*, vol. 33, No. 10A, pp. 312–313 (Mar. 1991).

"Copper Multilevel Interconnections," *IBM Technical Disclosure Bulletin*, vol. 33, No. 11, pp. 299–300 (Apr. 1991).

"End–Point Detection of Chemical/Mechanical Polishing of Thin Film Structures," *IBM Technical Disclosure Bulletin*, vol. 34, No. 4A, pp. 198–200 (Sep. 1991).

"End–Point Detection of Chemical/Mechanical Polishing of Circuitized Multilayer Substrates," *IBM Technical Disclosure Bulletin*, vol. 34, No. 4B, pp. 406–407 (Sep. 1991).

"Damascene Process for Simultaneously Inlaying Tungsten into Lines and Contacts," *IBM Technical Disclosure Bulletin*, vol. 34, No. 7A, pp. 1–2 (Dec. 1991).

"Multilevel Interconnection Structure," *IBM Technical Disclosure Bulletin*, vol. 34, No. 9, p. 220 (Feb. 1992).

"Diamond–Like Films as a Barrier to Chemical–Mechanical Polish," *IBM Technical Disclosure Bulletin*, vol. 35, No. 1B, pp. 211–213 (Jun. 1992).

Kaufman, F.B., et al., "Chemical–Mechanical Polishing for Fabricating Patterned W Metal Features as Chip Interconnects," *J. Electrochem. Soc.*, vol. 138, No. 11, pp. 3460–3465 (Nov. 1991).

Kaanta, C.W., et al., "Dual Damascene: A ULSI Wiring Technology," VMIC Conference, pp. 144–152 (Jun. 11–12, 1991).

Gardner, D.S., et al., "Encapsulated Copper Interconnection Devices Using Sidewall Barriers," VMIC Conference, pp. 99–108 (Jun. 11–12, 1991).

Warnock, T., "A Two–Dimensional Process Model for Chemimechanical Polish Planarization," *J. Electrochem. Soc.*, vol. 138, No. 8, pp. 2398–2402 (Aug. 1991).

Hu, C–K., et al., "Copper–Polymide Wiring Technology for VLSI Circuits," *Tungsten and Other Advanced Metals for VLSI/ULSI Applications V*, Materials Research Society, pp. 369–373 (1990).

Gardner, D.S., et al., "Interconnection and Electromigration Scaling Theory," *IEEE Transactions on Electron Devices*, vol. ED–34, No. 3, pp. 633–643 (Mar. 1987).

Arita, Y., et al., "Deep Submicron Cu Planar Interconnection Technology Using Cu Selective Chemical Vapor Deposition," *IEDM Technical Digest*, International Electron Devices Meeting, Washington, D.C., pp. 893–895 (Dec. 3–6, 1989).

Hoshino, K., et al., "High Temperature RIE of Copper Films," The Japan Society of Applied Physics, 36th Spring Meeting, Extended Abstracts, p. 570 (Mar. 1989)(English Summary).

Ohno, K., et al., "High Rate Reactive Ion Etching of Copper Films in SiCl4, N2, Cl2 and NH3 Mixture," *Extended Abstracts of the 22nd (1990 International) Conference on Solid State Devices and Materials*, Sendai, Japan, pp. 215–218 (Aug. 22–24, 1990).

Ohno, K., et al., "The Influence of NH3 Addition and Pressure on the Profile of RIE Copper Films," The Japan Society of Applied Physics, 38th Spring Meeting, Extended Abstracts, p. 500 (Mar. 1991)(English Summary).

Ohno, K., et al., "Reactive Ion Etching of Copper Films in SiCl4 and N2 Mixture," *Japanese Journal of Applied Physics*, vol. 28, No. 6, pp. L 1070–L 1072 (Jun. 1989).

Rogers, B., et al., "Issues in a Submicron Cu Interconnect System Using Liftoff Patterning," *1991 Proceedings Eighth International IEEE VLSI Multilevel Interconnection Conference (VMIC)*, Santa Clara, California, pp. 137–143 (Jun. 11–12, 1991).

Schwartz, G.C., et al., "Reactive Ion Etching of Copper Films," *Journal of the Electrochemical Society*, vol. 130, No. 8, pp. 1777–1779 (Aug. 1983).

Carter W. Kaanta et al., "Dual Damascene: A ULSI Wiring Technology," Jun. 11–12, 1991 VMIC Conference, pp. 144–152.

J. Warnock, "A Two–Dimensional Process Model for Chemimechanical Polish Planarization," *Journal of the Electrochemical Society*, vol. 138, No. 8, Aug. 1991, pp. 2398–2402.

Donald S. Gardner et al., "Encapsulated Copper Interconnection Devices Using Sidewall Barriers," Jun. 11–12, 1991 VMIC Conference, pp. 99–108.

C–K Hu et al., "Copper–Polyimide Wiring Technology for VLSI Circuits," *Tungsten and Other Advanced Metals for VLSI/ULSI Appilcations V*, Materials Research Soc., pp. 369–373 (Sep. 1989).

D.S. Gardner et al., "Interconnection and Electromigration Scaling Theory," *IEEE Transactions on Electron Devices*, vol. ED–34, No. 3, Mar. 1987, pp. 633–643.

F.B. Kaufman et al., "Chemical–Mechanical Polishing for Frabricating Patterned W Metal Features as Chip Interconnects," *Journal of the Electrochemical Society*, vol. 138, No. 11, Nov. 1991, pp. 3460–3465.

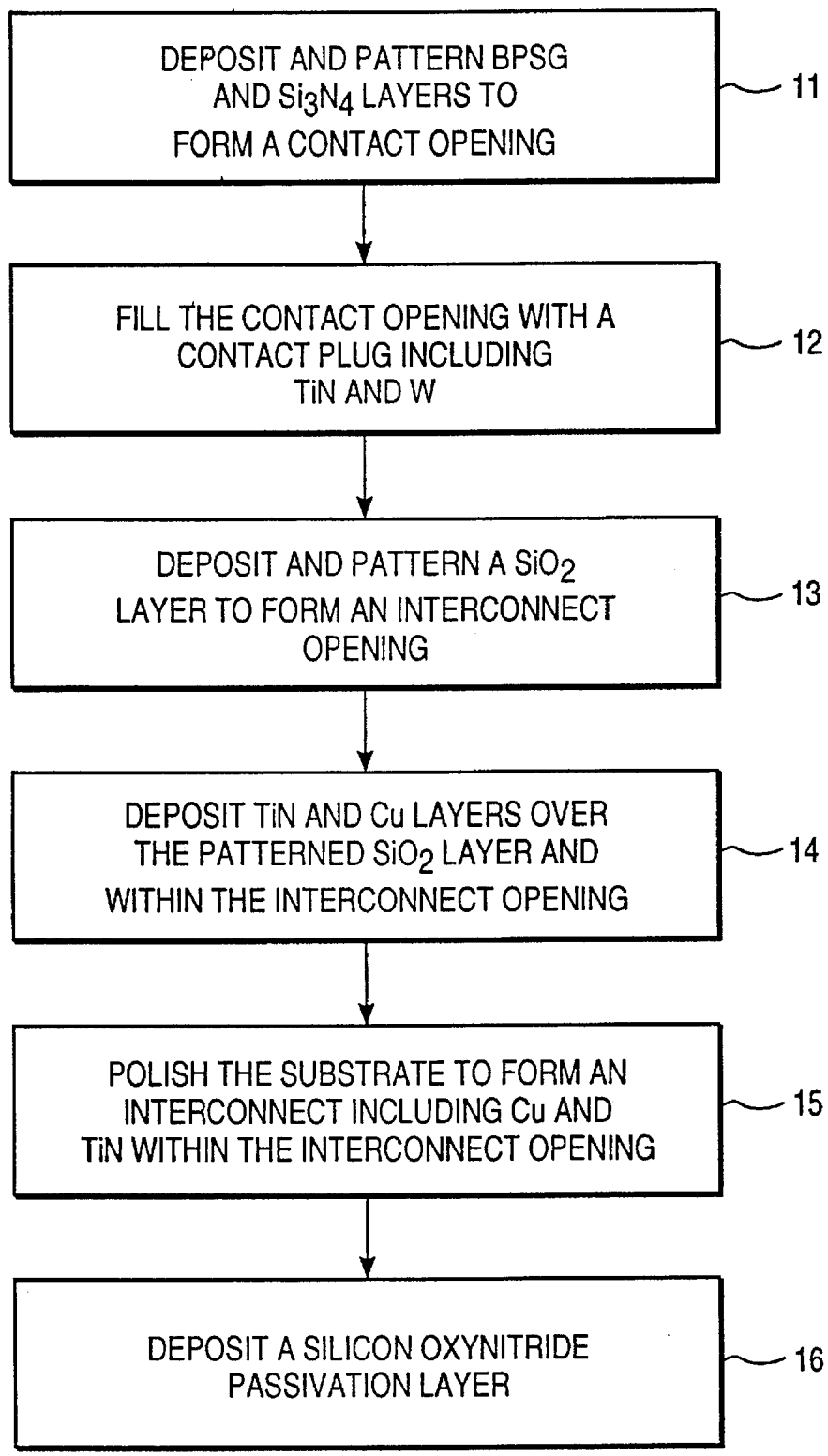
FIG_1

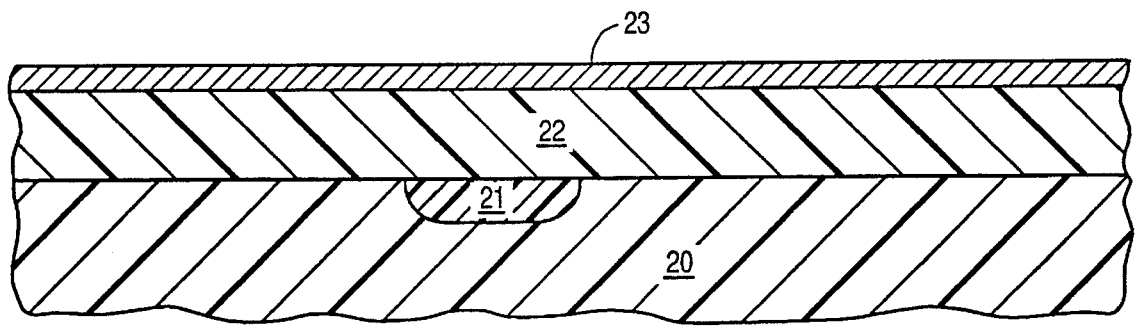
FIG_2
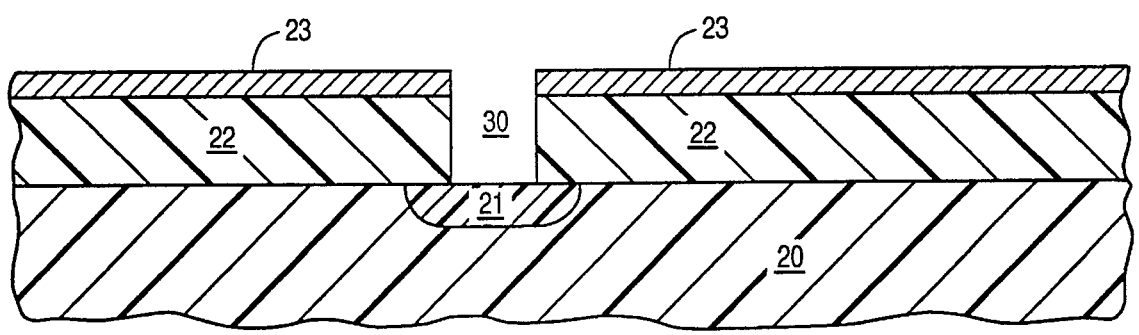
FIG_3
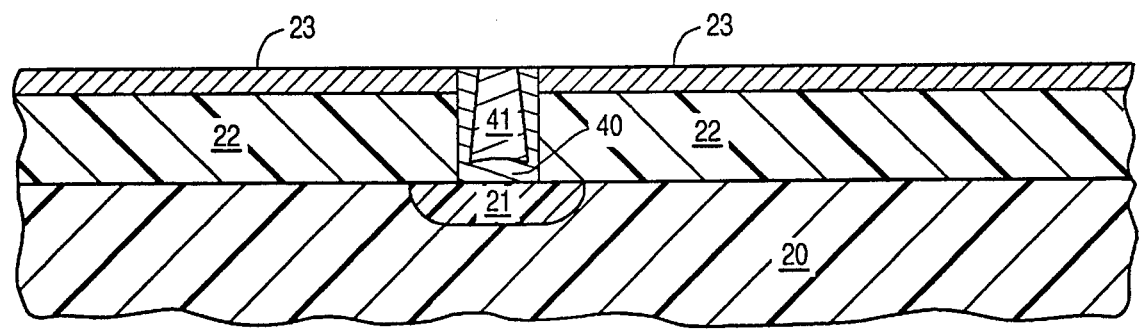
FIG_4

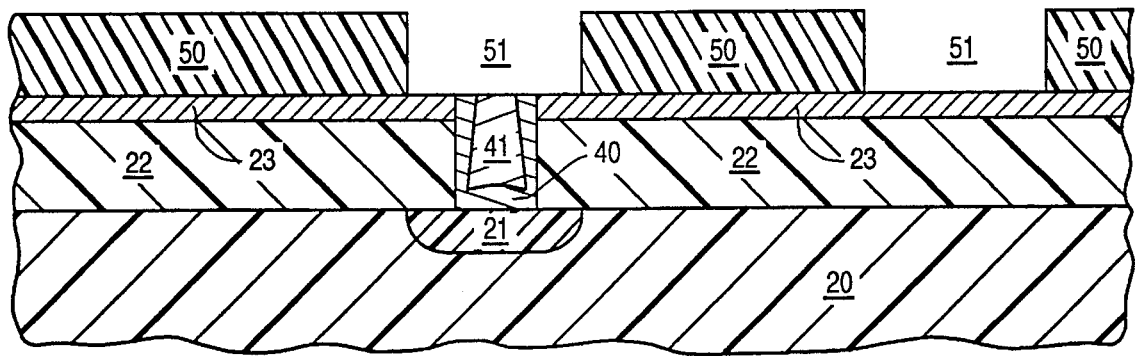
FIG_5
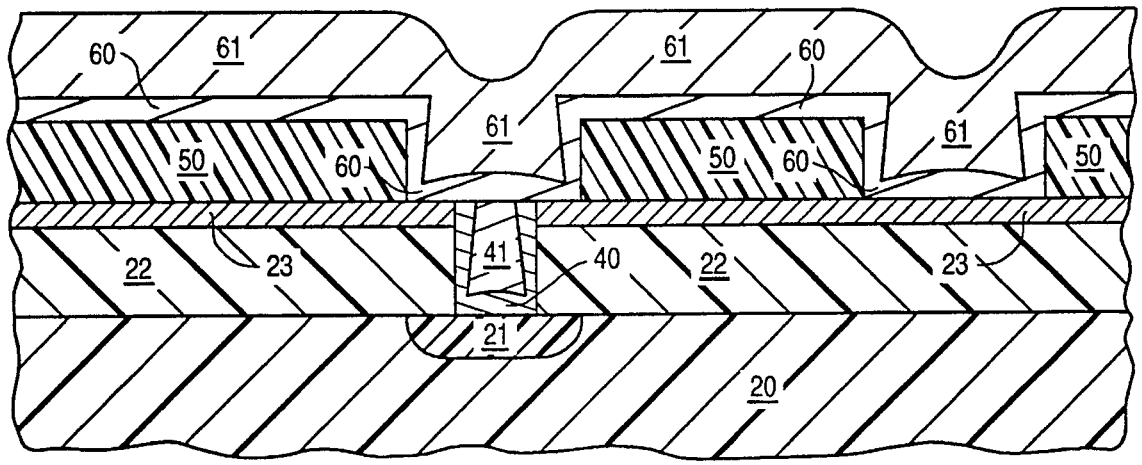
FIG_6
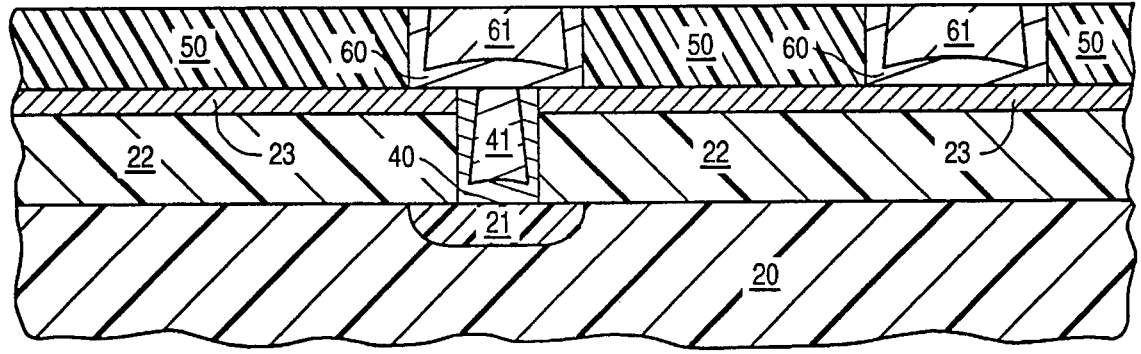
FIG_7

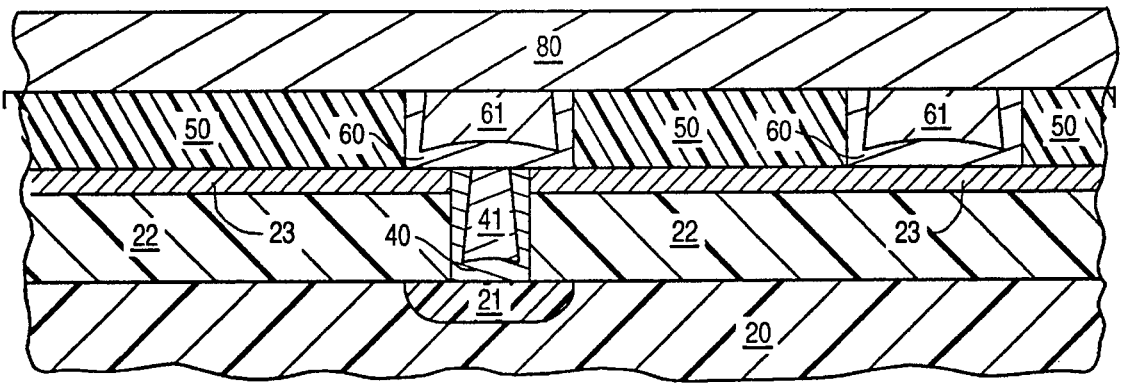
FIG_8
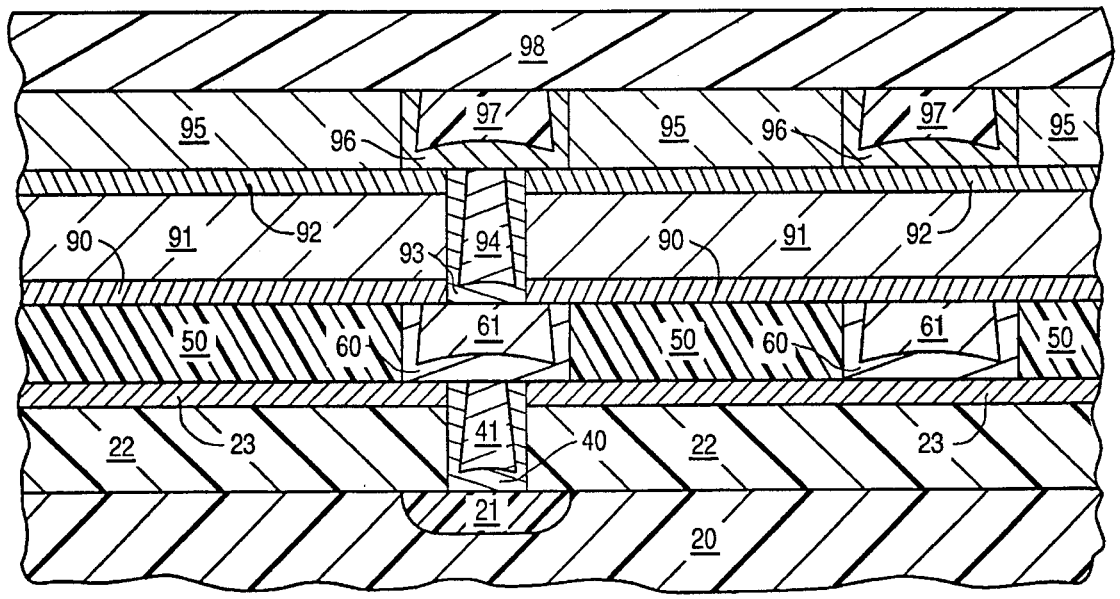
FIG_9
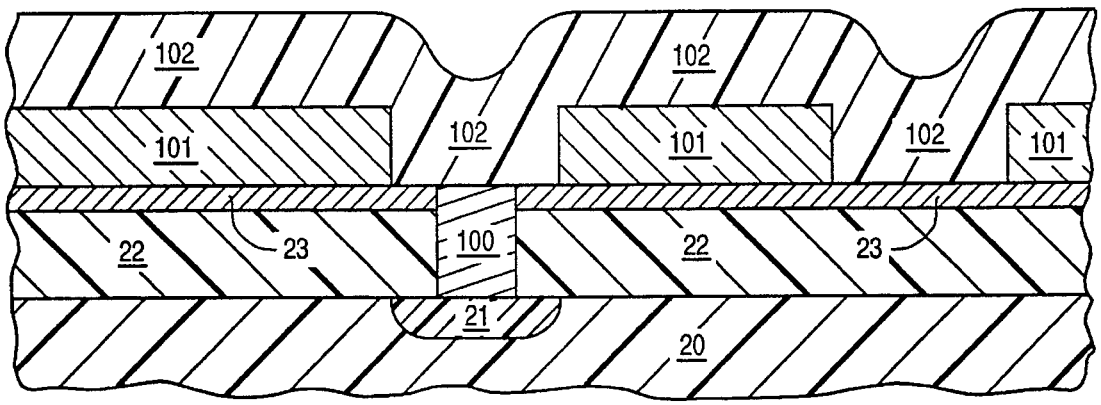
FIG_10

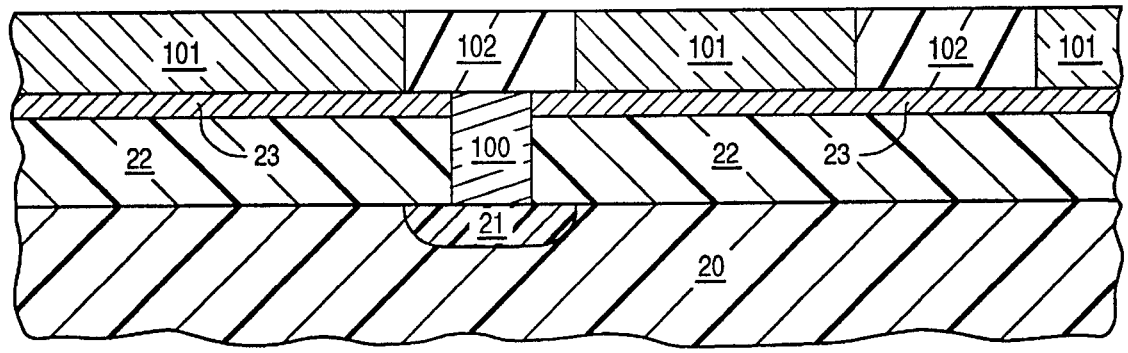
FIG_11
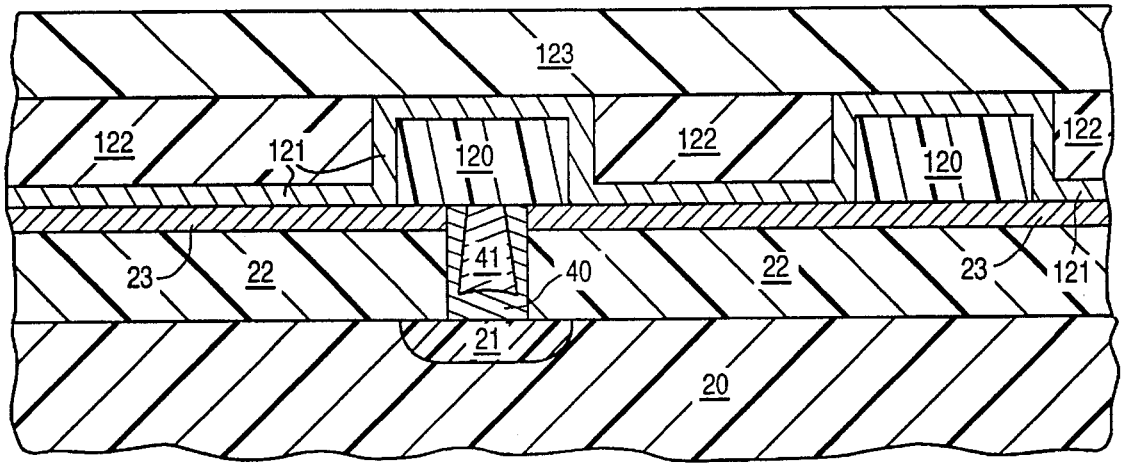
FIG_12
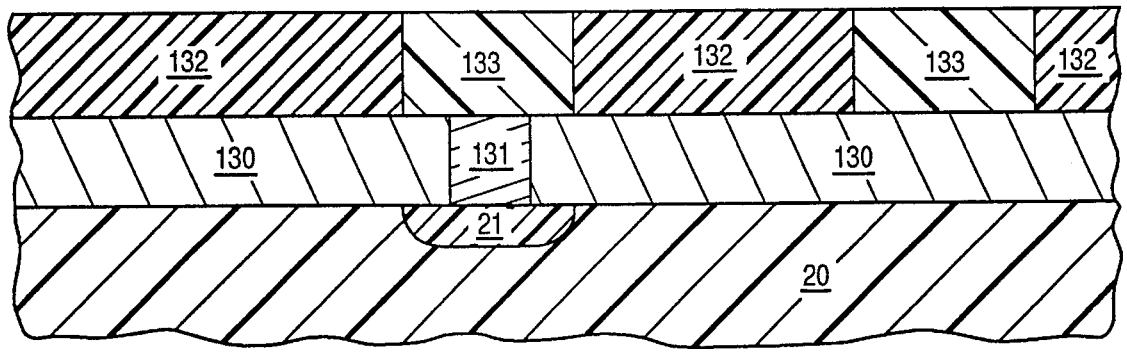
FIG_13

5,612,254

METHODS OF FORMING AN INTERCONNECT ON A SEMICONDUCTOR SUBSTRATE

FIELD OF THE INVENTION

The present invention relates to the field of semiconductor devices, and in particular, to the formation of interconnections for those devices.

BACKGROUND OF THE INVENTION

As devices are scaled to sub-micron dimensions, formation of reliable, sub-micron interconnections (interconnects) becomes increasingly important. Also important for sub-micron devices is the use of planarization technologies during interconnect and wiring formation, as well as other stages of device formation. Many current processes used to form interconnects are unable to form interconnects with a sub-micron width in production. These processes fail for one or more reasons as described below.

A common method of forming an interconnect includes the steps of: 1) forming a patterned dielectric layer having contact openings to at least one underlying layer; 2) depositing a metal layer over the patterned dielectric layer; 3) forming a patterned photoresist layer over the metal layer; 4) etching the metal layer to form the interconnect; and 5) removing the patterned photoresist layer. This method has several problems. First, the metal layer typically has poor step coverage that causes the metal to be thinner along the walls of the contact openings. The thin metal increases resistance and may break when the device is stressed, causing an open circuit. Second, there may be problems with etching. Wet chemical etchants etch isotropically and generally give insufficient dimensional control for sub-micron devices. Dry etching is typically used, but some metal layers, such as copper and gold, are difficult to plasma etch. Third, aluminum can be plasma etched, but it also has problems. The substrate is typically alloyed or subjected to at least one heat cycle after the aluminum has been deposited and patterned. The heat cycle may cause the aluminum to spike into the silicon substrate lying at the bottom of a contact opening. Also, aluminum can form hillocks during an alloy or other post-metalization heat cycles. The hillocks may protrude from the interconnect to make electrical connection between adjacent interconnects, thereby shorting the interconnects together. Fourth, even if the interconnects may be formed without any of the previous problems, a subsequent dielectric layer that covers the interconnects typically has step coverage problems between narrowly spaced interconnects or requires a planarization process sequence.

Selective Electroless Metal Deposition (SEMD) is a method capable of forming an interconnect with a sub-micron width. A dielectric layer is deposited and patterned to form a patterned dielectric layer having an interconnect channel. As used in this specification, an interconnect channel is a pattern within a dielectric layer, wherein part of the dielectric layer is etched away. The interconnect is subsequently formed within the interconnect channel. Before depositing the metal using SEMD, the surface upon which the metal is to be deposited typically needs a treatment within the interconnect channel, so that metal deposits within the interconnect channel but not on the patterned dielectric layer. A common technique for treating the surface includes very heavily doping the interconnect channel with silicon ions at a dose of at least $1\times10^{16}$ ions/cm$^2$. Another treatment method includes contacting the surface with an activating solution. Surface treatments typically involve at least one additional processing step and may cause processing complications. Surface treatments may not be completely effective, such that metal does not properly deposit within the interconnect channel. In addition, particles and other foreign materials may lie on the dielectric layer and act as nucleating sites during the metal deposition. Therefore, metal particles are typically formed on the patterned dielectric layer. The metal particles may cause electrical shorts or other defects within the device. The inconsistent effectiveness and complications of the surface treatments steps and the formation of metal particles have prevented the SEMD method from being used in a production mode.

Dual damascene is another method of forming interconnects within interconnect channels. A single dielectric layer is deposited and patterned using a two-step etch process. The first step etches most of the dielectric layer within contact openings and the second step etches the interconnect channels and the rest of the dielectric layer within the contact openings. The depth of the interconnect channels are difficult to control because of film deposition and etch nonuniformities. The interconnect channels may be too deep in the center of the wafer and too shallow near the edge of the same wafer, resulting in large variations of interconnect resistance across the wafer. Metal deposition is complicated because the contact openings may have an aspect ratio of 2:1, 3:1, or more. The high aspect ratio makes sputter depositions virtually impossible. A metal layer may be deposited by chemical vapor deposition within the contact openings and interconnect channels. However, widely used interconnect materials such as aluminum, copper, gold, and silver are not typically deposited by chemical vapor deposition in production. Polysilicon and tungsten may be deposited by chemical vapor deposition, but these materials have higher resistivities compared to aluminum, copper, gold, and silver and are not generally used as interconnect materials. The SEMD method may be used but has the previously discussed problems. In addition, the SEMD method may form a metal void if metal deposited within the interconnect channels seal off their underlying contact openings before the contact openings are filled.

Copper is typically not used as an interconnect material. Although copper has a relatively low cost and low resistivity, it has a relatively large diffusion coefficient into silicon dioxide and silicon. Copper from an interconnect may diffuse into the silicon dioxide layer causing the dielectric to be conductive and decreasing the dielectric strength of the silicon dioxide layer. Copper interconnects should be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared to silicon dioxide. The high dielectric constant causes an undesired increase in capacitance between the interconnect and other interconnects and the substrate.

SUMMARY AND OBJECTS OF THE INVENTION

The embodiments of the present invention form an interconnect channel and an interconnect within a semiconductor device. In general, a first dielectric layer is deposited over a substrate and patterned to form a contact or via opening that is filled to form a contact or via plug. A second dielectric layer is deposited over the patterned first dielectric layer and the contact or via plug and is selectively etched to form an interconnect channel in the second dielectric layer. The first or second dielectric layers may comprise more than one individual dielectric layer. Preferably, the first dielectric layer acts as an etch stop when the second dielectric layer is selectively etched to form the interconnect channel. An interconnect layer is deposited over the second dielectric layer and within the interconnect channel. The substrate is polished with a polishing solution to remove that portion of the interconnect layer that lies on the second dielectric layer to form an interconnect within the interconnect channel. The interconnect layer may include a barrier layer and a metal layer. Additional interconnect levels may be formed in a similar manner. If needed, a diffusion barrier layer may be deposited before forming another interconnect level. A passivation layer is deposited over the uppermost interconnect level.

The embodiments have numerous benefits over prior art methods. The depth of the interconnect channels is easier to control because the first dielectric layer acts as an etch stop when selectively etching the second dielectric layer. A longer overetch during interconnect channel formation may be used without significantly etching the first dielectric layer. A copper interconnect may be formed, which may be thinner than an aluminum interconnect while giving the same or lower resistance. The polishing step forms a substantially planar substrate surface. Therefore, additional steps required for planarization schemes are not needed. One embodiment includes an encapsulated metal layer to provide more flexibility when selecting dielectric, metal, and plug materials.

Other objects, features, and advantages of the present invention will be apparent from the accompanying drawings and from the detailed description that follows.

BRIEF DESCRIPTION OF THE DRAWINGS

The present invention is illustrated by way of example and not limitation in the following figures in which:

FIG. 1 shows a flow diagram of a currently preferred embodiment.

FIG. 2 shows a cross-sectional view of a substrate including a monocrystalline silicon layer and a doped region, a borophosphosilicate glass layer, and a silicon nitride layer.

FIG. 3 shows the substrate of FIG. 2 after a contact opening within the borophosphosilicate glass and silicon nitride layers has been formed.

FIG. 4 shows the substrate of FIG. 3 after the contact opening has been filled with a contact plug.

FIG. 5 shows the substrate of FIG. 4 after a patterned silicon dioxide layer having interconnect channels has been formed over the patterned silicon nitride layer in accordance with a currently preferred embodiment.

FIG. 6 shows the substrate of FIG. 5 after a titanium nitride layer and a copper layer have been deposited over the patterned silicon dioxide layer and within the interconnect channels.

FIG. 7 shows the substrate of FIG. 6 after chemical mechanical polishing with a polishing solution in accordance with a currently preferred embodiment.

FIG. 8 shows the substrate of FIG. 7 after a silicon oxynitride passivation layer have been deposited over the patterned silicon dioxide layer and the interconnects.

FIG. 9 shows the substrate in FIG. 7 after forming a second interconnect level including a via and depositing a silicon oxynitride passivation layer.

FIG. 10 shows an alternate embodiment having a tungsten contact plug and an aluminum interconnect layer.

FIG. 11 shows the substrate in FIG. 10 after chemical mechanical polishing to form interconnects within the interconnect channels in accordance with an alternate embodiment.

FIG. 12 shows an alternate embodiment having encapsulated copper interconnects.

FIG. 13 shows a substrate having a tungsten contact plug and gold interconnects in accordance with an alternate embodiment.

DETAILED DESCRIPTION

The embodiments of the present invention form an interconnect channel and an interconnect within a semiconductor device. In general, a first dielectric layer is deposited over a substrate and patterned to form a contact or via opening that is filled to form a contact or via plug. A second dielectric layer is deposited over the patterned first dielectric layer and the contact or via plug and selectively etched to form an interconnect channel. The first or second dielectric layers may comprise more than one individual dielectric layers. Preferably, the first dielectric layer acts as an etch stop when the second dielectric layer is selectively etched to form the interconnect channel. An interconnect layer is deposited over the patterned dielectric layer and within the interconnect channel. The substrate is polished with a polishing slurry to remove that portion of the interconnect layer that lies on the patterned second dielectric layer to form an interconnect within the interconnect channel. The interconnect layer may include a barrier layer and a metal layer. Additional interconnect levels may be formed in a similar manner. If needed, a diffusion barrier layer may be deposited before forming another interconnect level. A passivation layer is deposited over the uppermost interconnect level.

A number of materials may be used with the present invention. In general, the dielectric layers comprise one or more layers of silicon nitride, silicon dioxide (doped or undoped), silicon oxynitride, fluoropolymer, parylene or polyimide. The interconnect and metal layers may include aluminum, aluminum alloys (including, for example, Al-Cu, Al.CU-Ti, Al-Sc), copper, gold, silver, tungsten, or molybdenum; the barrier layer may include tungsten, tantalum, titanium nitride, niobium, or molybdenum; the contact plug may include tungsten, tantalum, titanium nitride, molybdenum, polysilicon, or a silicide (including for example, $TiSi_x$, $WSi_x$, $NiSi_x$, $MoSi_x$, $TaSi_x$, $PdSi_x$, $CoSi_x$, and others); and the diffusion barrier layer may include silicon nitride, phosphosilicate glass (PSG), silicon oxynitride, aluminum, aluminum oxide ($Al_xO_y$), tantalum, titanium nitride, nionbium, or molybdenum. These materials are preferably deposited by chemical vapor deposition (CVD), or they can be deposited by sputter deposition.

The selection of materials depends on a number of factors. A contact or via opening may be deep relative to its width and should be at least partially filled with a material that is deposited by chemical vapor deposition. Therefore, the contact or via plugs may include tungsten or heavily doped polysilicon since these materials can easily be deposited by chemical vapor deposition. The first and second dielectric layers typically include different materials, so that the first dielectric layer acts as an etch stop when patterning the second dielectric layer to form the interconnect channel. If the metal layer significantly diffuses into a dielectric layer, the metal layer must be encapsulated by diffusion barriers.

One material that is a diffusion barrier against one metal may not be a diffusion barrier for another metal. The embodiments described include various dielectric, diffusion barrier, and metal combinations. Every possible combination of dielectric, diffusion barrier, and metal is not included in this specification due to the large number of possible combinations. Tests may be conducted to determine diffusivities and interactions of metals with silicon, dielectric layers, or refractory metals. The materials to be tested are formed on a substrate and subjected to the highest temperature cycle to which the material will be exposed. Diffusivities and interactions may be determined by methods including Auger analysis, SIMS analysis, voltage-capacitance measurements, current-voltage measurements etc., for example. If the diffusivities and interactions are acceptable, the materials may be used as the dielectric, diffusion barrier, or metal materials when forming the interconnects.

The embodiments may be used to make electrical contact to device structures including polysilicon gates, word lines, source regions, drain regions, bit lines, bases, emitters, collectors, etc. Although the present invention is illustrated in conjunction with making electrical contact to an $N^+$ region in a silicon layer, it will be obvious to one skilled in the art that the present invention can be used with any semiconductor technology including NMOS, PMOS, CMOS, BiCMOS, bipolar, multi-chip modules (MCM) and III-VI semiconductors.

FIG. 1 includes a flow diagram of the current preferred embodiment of the present invention. In general, borophosphosilicate glass (BPSG) and silicon nitride layers are deposited and patterned to form with a contact opening that is filled with a contact plug including titanium nitride and tungsten. Next, a silicon dioxide layer is deposited and patterned to form an interconnect channel. Titanium nitride and copper layers are deposited over the patterned dielectric layer and within the interconnect channel. The substrate is then chemically mechanically polished to remove that portion of the titanium nitride and copper layers that lie on the patterned silicon dioxide layer. After the polishing step, additional interconnect levels may be formed over the substrate in a similar manner. A silicon oxynitride passivation layer is deposited over the substrate after the last interconnect layer is formed.

The patterning of the interconnect channels described below can be performed by any one of several well known method. For line widths in the deep submicron range (approximately 0.5 μ and less), E-beam, X-ray, or deep UV lithography may be used, for example. In the present invention, deep UV lithography on a stepper system has been utilized to produce reliably channels having a width of approximately 0.4 μ.

In a currently preferred embodiment, an interconnect makes electrical contact to an $N^+$ region within a semiconductor substrate. FIG. 2 includes the substrate having a monocrystalline silicon layer 20 and an $N^+$ region 21. A borophosphosilicate glass (BPSG) layer 22 is deposited over the substrate. The BPSG layer includes silicon dioxide, about 4 weight % boron, and 4 weight % phosphorus and is deposited to a thickness of about 8000 Å. The thickness of the B PSG layer 22 can be in the range of approximately 5000 to 10,000 Å, and the boron and phosphorus content can vary depending on the characteristics that are desired for the BPSG layer 22 including sodium ion gettering and flow characteristics of the glass layer. The BPSG layer 22 is subjected to a thermal cycle to densify or reflow the BPSG layer 22. The conditions for the thermal cycle are well known in the art. A silicon nitride layer 23 about 1000 Å thick is deposited over the BPSG layer 22. The silicon nitride layer 23 is relatively thin compared to the BPSG layer 22 but is thick enough to act as an etch stop during a subsequent etch step. The silicon nitride layer should be about 500 Å to 1500 Å thick. In a preferred embodiment, BPSG layer 22 and silicon nitride layer 23 make up the first dielectric layer.

The substrate is coated with a photoresist layer which is exposed and developed to form a patterned photoresist layer having openings over regions to be contacted such as region 21 (not shown). The silicon nitride and BPSG layers exposed by the opening in the photoresist layer are then etched by well-known methods. The photoresist layer is removed leaving a patterned first dielectric layer having a contact opening 30 about 0.5 μm wide extending to the $N^+$ region 21 as shown in FIG. 3. Next, a titanium nitride layer 40 about 1200 Å. thick is deposited over the patterned first dielectric layer and within the contact opening. The titanium nitride layer 40 is typically deposited to a thickness between 500 Å and 1500 Å. A tungsten layer 41 is chemically deposited to a thickness about 5000 Å. The tungsten layer 41 must be at least thick enough such that the combination of the titanium nitride layer 40 and the tungsten layer 41 completely fills the contact opening 30. The substrate is anisotropically etched to form a contact plug, which includes the titanium nitride layer 40 and the tungsten layer 41 as shown in FIG. 4. In an alternate embodiment, the contact plug may comprise of tungsten, heavily doped polysilicon, or a silicide as long as 1) the tungsten, heavily doped polysilicon, or silicide is a diffusion barrier to a subsequently deposited metal layer or 2) a barrier layer is deposited over the tungsten, the heavily doped polysilicon, or the silicide before depositing a metal layer.

Next, a silicon dioxide layer is deposited to a thickness of approximately 6000 Å. A photoresist layer is coated over the silicon dioxide layer and patterned to form a patterned photoresist layer having an interconnect channel pattern (not shown). The silicon dioxide layer exposed by the patterned photoresist layer is etched using reactive ion etching (RIE) in a preferred embodiment to form interconnect channels 51. The RIE gas chemistry can be chosen by one skilled in the art such that silicon nitride, titanium nitride, and tungsten etch at a slower rate than silicon dioxide. Therefore, silicon nitride layer 23 acts as an etch stop during the interconnect channel etch step. The patterned photoresist layer is removed leaving a patterned silicon dioxide layer 50 having interconnect channels 51 each about 0.1 μm wide or greater extending to the silicon nitride layer 23 or the contact plug as shown in FIG. 5. After forming the interconnect channels 51, a titanium nitride barrier layer 60 is deposited to a thickness of about 1200 Å over the patterned silicon dioxide layer 50 and within the interconnect channels 51. The barrier layer 60 needs to be thick enough to act as a diffusion barrier for a subsequently deposited copper layer and is deposited to a thickness between approximately 500 Å to 1500 Å. A copper metal layer 61 is deposited to a thickness of about 6000 Å over the barrier layer 60, as shown in FIG. 6. The metal layer thickness may be varied as long as the interconnect channels 51 are filled by the barrier layer 60 and the metal layer 61. There is no upper limit on the thickness of the metal layer 61, but a thicker metal layer 61 makes a subsequent metal polishing step longer and is generally not desired.

The substrate is chemically mechanically polished with a polishing solution to remove that portion of the barrier layer 60 and the metal layer 61 that lie on the patterned dielectric layer to form interconnects within the interconnect channels 51 as shown in FIG. 7. The polishing is done using a chemical mechanical polisher, such as the Westech 372™ polisher or similar polishers made by Strasbaugh, Cybeq, and Speedfam. The polishing solution in a preferred embodiment comprises approximately 10% by weight colloidal silica having a particle size of about 0.3 μm and about 5% by weight ammonium hydroxide. The polishing solution in a preferred embodiment has a pH of about 10.5, but may be in the range of approximately 9 to 13.

The polishing pad preferably is a polyurethane-based pad and may include plastic microballoons. The polishing pads may include the SUBA family of woven felt pads made by Rodel. The polishing pressure preferably is about 4 psi, although pressures as high as 14 psi may be used. The platen and carrier each preferably rotate at about 35 rpm, but either can be varied from 0 to 100 rpm. Using a preferred embodiment, the removal rate of the metal layer should be about 1200 Å/minute.

Formulations other than those given above may be used for the polishing solution. For example, alumina may be used instead of silica. The solution does not require any solids, but if solids are included, the solids should not make up more than 10 weight % of the solution. The particle size may vary from 0.05 μm to 1.0 μm. Smaller particles generally give better selectivity and etch at a slower rate, and larger particles generally have worse selectivity and etch at a faster rate. Additions other than ammonium hydroxide can be added to react with and dissolve the metal being polished. For example, prior art neutral or acidic solutions (pH less that 7) may be used to polish copper or other metals.

FIG. 7 illustrates one interconnect making electrical connection with the N$^+$ region 21 and the other interconnect making electrical contact to other portions of the substrate (not shown). The interconnect lies on the patterned silicon nitride layer and the contact plug. Contrary to the prior art, the interconnects may lie on silicon nitride without a significant decrease in device performance if the silicon nitride layer is not too thick (no greater than about 1500 Å). A silicon oxynitride passivation layer 80 is deposited over the substrate as shown in FIG. 8.

The present invention has numerous benefits over prior art methods. The silicon nitride layer 23 acts as an etch stop during the formation of the interconnect channels 51. Because of film thickness and etch rate variations across the substrate, the etch step used to form the interconnect channels 51 would etch a significant amount of the BPSG layer beneath the interconnect channels 51 if the silicon nitride layer 23 were not present. The silicon nitride layer 23 allows a longer overetch during the interconnect channel etch step without etching the BPSG layer. The longer overetch ensures that interconnect channels 51 are completely etched in all areas of the substrate regardless of variations in the thickness of silicon dioxide layer 50. The interconnect includes copper, which has a lower resistivity compared to aluminum. Therefore, a thinner interconnect can be used while giving the same or lower resistance and a higher reliability. The polishing step forms a substantially planar substrate surface. (Note, when used in this context, "substrate" includes the semiconductor substrate as well as all layers fabricated on the semiconductor substrate up to the point of processing under discussion. Therefore, substrate surface refers to the present uppermost surface of the substrate, including all structures formed thereon.) Therefore, additional steps required for planarization schemes are not needed. The copper within the interconnects is encapsulated to prevent copper diffusion into a silicon dioxide layer. FIG. 8 illustrates the copper being surrounded by the titanium nitride barrier layer 60 and the silicon oxynitride passivation layer 80. Titanium nitride and silicon oxynitride act as diffusion barriers to the copper.

Furthermore, in the prior art, an interconnect formed by deposition of a metal layer, patterning and etch must be wider than the width of the contact region with which the interconnect is making connection in the area where contact is made. This is due to the fact that the patterning layer can be misaligned. If the interconnect line width were equal to the contact region width, then the misalignment would allow etchant to reach the contact fill material. Since the contact fill material and the interconnect material are usually the same or similar materials, this causes etching of the contact fill during the interconnect etch. Generally, in the prior art, the interconnect line must be at least as wide as the contact region plus twice the alignment tolerance (to allow for misalignment in any direction) in the area where it makes contact to a contact plug. This consumes a considerable amount of area on the chip, thereby limiting scaling. Although many prior art layouts stagger the location of contact regions to minimize the effect, the presence of the widened region on each interconnect line causes adjacent interconnects to be spaced further apart than if no widened region were present.

In contrast to the prior art, the interconnects of the present invention can be the same width at the contact region, even if both the interconnect and the contact fill are formed of the same metal. For example, the interconnect formed by layers 60 and 61 in interconnect channel 51 overlying the contact plug formed by layers 40 and 41 of FIG. 8 needs only be as wide as the contact plug. (Although it can be wider, as shown). As can be readily appreciated, even if the interconnect is only as wide as the contact plug, there will be no etching of the contact plug when the interconnect is formed by polishing as described above. This is true even if the interconnect channel 50 had been misaligned as no etchant can reach the contact plug since polishing proceeds only until the upper level of silicon dioxide layer 50 is reached.

The present invention may be used to form more than one level of interconnects as shown in FIG. 9. After polishing the substrate (FIG. 7), a second silicon nitride layer 90, a second silicon dioxide layer 91, and a third silicon nitride layer 92 are deposited over the substrate. The three layers are patterned to form a via opening to one of the first level interconnects. A second titanium nitride layer 93 and a second tungsten layer 94 are deposited and anisotropically etched to form a via plug within the via opening. Formation of the via opening and the via plug is similar to the formation of the contact opening and the contact plug. A contact plug makes electrical contact between the first interconnect level and the silicon substrate, whereas a via plug makes electrical contact between different interconnect levels. A third silicon dioxide layer 95 is deposited and patterned to form a second level interconnect channel. The third silicon nitride layer 92 acts as an etch stop during the formation of the second level interconnect channels. A second titanium nitride barrier layer 96 and a second copper metal layer 97 are deposited and chemically mechanically polished to form a second level interconnect. Formation of the second level interconnect channel and the second level interconnect are similar to formation of the first level interconnect channel and the first level interconnect, respectively. Other interconnect levels may be formed in a similar manner. After forming all of the interconnect levels, a silicon oxynitride passivation layer 98 is deposited over the substrate. Referring to FIG. 9, copper is encapsulated by titanium nitride and silicon nitride or titanium nitride and silicon oxynitride.

FIGS. 10 and 11 illustrate an alternate embodiment of the present invention. In general, metals other than copper can be used to form interconnects according to the methods of the present invention. However, the chemical mechanical polishing works best with methods which are deposited conformally, and is therefore preferably used with metals which are CVD deposited or are otherwise reflowed. Although aluminum or aluminum alloys, for example, are difficult to deposit conformally, they can be used in the alternate embodiment described herein. Briefly referring to FIG. 3, the BPSG layer 22 and the silicon nitride layer 23 are deposited and patterned to form the contact opening 30 to the $N^+$ region 21. A tungsten layer is chemically deposited and anisotropically etched to form a contact plug 100 as shown in FIG. 10. A silicon dioxide layer 101 is deposited in the range of approximately 0.5–1.0 µ thick and patterned to form interconnect channels about 0.8 µm wide. The silicon nitride layer 23 and the contact plug 100 act as etch stops during the interconnect channel formation. An aluminum or aluminum alloy layer 102 is sputter deposited to a thickness of about 8000 Å. The substrate is chemically mechanically polished with the polishing solution described above to remove the aluminum layer 102 that lies over the patterned silicon dioxide layer 101 to form interconnects within the interconnect channels as shown in FIG. 11. Other additional interconnect levels may be formed (not shown). A passivation layer comprising silicon oxynitride or phosphosilicate glass is deposited over the uppermost interconnect level (not shown). The aluminum interconnects are not encapsulated because aluminum does not diffuse into silicon dioxide as opposed to copper. Since aluminum has a higher resistivity than copper, the line width of the aluminum interconnect of FIG. 1 is greater than the line width of the copper interconnects of FIG. 9. The tungsten contact plug acts as a diffusion barrier between the aluminum interconnect and the $N^+$ region. Therefore, silicon is not needed within the aluminum layer.

FIG. 12 illustrates a further alternate embodiment that encapsulates an interconnect so that it does not diffuse into adjacent layers. Briefly referring to FIG. 5, the substrate includes the $N^+$ region 21, the patterned BPSG layer 22, and silicon nitride layer 23, the contact plug including the titanium nitride layer 40 and the tungsten layer 41, and patterned silicon dioxide layer 50 (not shown in FIG. 12) including interconnect channels 51 (not shown in FIG. 12) that are formed as described above. A copper metal layer 120 is deposited over the patterned silicon dioxide layer 50 and within the interconnect channels 51 and chemically mechanically polished with an alkaline polishing solution to form copper interconnects 120 that lie on the contact plug and part of the patterned silicon nitride layer as shown in FIG. 12. The patterned silicon dioxide layer is removed and a second silicon nitride layer 121 is deposited over the copper interconnects. A second silicon dioxide layer 122 is deposited over silicon nitride layer and is planarized by, for example, polishing. A silicon oxynitride passivation layer 123 is deposited over the second silicon dioxide 122 and the second silicon nitride layer 121. The copper interconnects are encapsulated by silicon nitride layers or the silicon nitride layers and the contact plug. Other materials such as molybdenum or tantalum may be used in place of the titanium nitride layer 40 of the contact plug. Also, molybdenum or tantalum may be used in place of the second silicon nitride layer 121, with some additional processing. Unlike the second silicon nitride layer 121, a molybdenum or tantalum layer over the copper interconnects 120 must be formed such that the top and sides of the interconnects 120 are covered, yet, the interconnects must not be electrically connected to each other. This can be done, for example, by an isotropic etching of material from the spaces or by selective deposition. The second silicon nitride layer 121 should be used with this embodiment to avoid the extra patterning step that may be difficult to perform because of narrow spaces between interconnect lines. Other interconnect levels may be formed before the passivation layer is deposited over the substrate.

FIG. 13 shows a further alternate embodiment including the substrate having the $N^+$ region 21. A BPSG layer 130 is deposited to a thickness of about 9000 Å and patterned to form a contact opening about 0.5 µm wide. A tungsten layer is chemically deposited over the patterned BPSG layer 130 and within the contact opening. The tungsten layer 131 is anisotropically etched to form a contact plug within the contact opening. A silicon dioxide layer 132 is deposited to about 8000 Å thick and patterned to form interconnect channels about 0.1 µm wide or greater. Because no etch stop is used, the silicon dioxide thickness and etch rate across the substrate need to be reasonably uniform to minimize overetch during interconnect channel etch step. A gold layer 133 is deposited over the patterned silicon dioxide layer and within the interconnect channels. The gold layer is deposited at least until the interconnect channels are filled. The substrate is chemically mechanically polished to form gold interconnects 133. Additional interconnect levels may be formed. After all interconnect levels are formed, a passivation layer comprising silicon oxynitride or phosphosilicate glass is deposited over the substrate. The gold interconnects 133 are not encapsulated because gold has a significantly lower diffusion rate into silicon dioxide compared to copper.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of forming an interconnect on a semiconductor substrate comprising the steps of:

depositing a first dielectric layer on said substrate;

patterning said first dielectric layer to form a patterned first dielectric layer having a first opening;

filling said first opening with a conductive plug;

depositing a second dielectric layer over said patterned first dielectric layer and said conductive plug;

patterning said second dielectric layer to form a patterned second dielectric layer having an interconnect channel, wherein part of said interconnect channel lies over at least part of said conductive plug, and wherein at least the upper portion of said first dielectric layer has a lower etch rate than said second dielectric layer such that said first dielectric layer acts as an etch stop;

depositing a barrier layer over said patterned second dielectric layer and within said interconnect channel;

depositing a metal layer over said barrier layer;

polishing said substrate with a polishing solution to remove that portion of said barrier and metal layers that lie on said patterned second dielectric layer to form said interconnect within said interconnect channel; and depositing a diffusion barrier layer over said patterned second dielectric layer and said interconnect.

2. The method of claim 1, wherein said first and said second dielectric layers comprise a material selected from the group consisting of silicon dioxide, silicon nitride, silicon oxynitride, fluoropolymer, parylene, and polyimide, and wherein said first opening is a type selected from the group consisting of a contact opening and a via opening, said conductive plug is a type selected from the group consisting of a contact plug and a via plug, and said conductive plug comprises a material selected from the group consisting of tungsten, tantalum, titanium nitride, molybdenum, silicide, and polysilicon.

3. The method of claim 1, wherein said barrier layer comprises a material selected from the group consisting of tungsten, tantalum, titanium nitride, niobium, and molybdenum, wherein said metal layer comprises a material selected from the group consisting of aluminum, aluminum alloy, copper, gold, silver, tungsten, and molybdenum, wherein said polishing solution comprises ammonium hydroxide and has a pH in a range of 9–13 and said polishing continues until the surface of said substrate is substantially planar, and wherein said diffusion barrier layer comprises a material selected from the group consisting of silicon nitride, niobium, silicon oxynitride, tantalum, titanium nitride, and molybdenum.

4. A method of forming an interconnect on a semiconductor substrate comprising the steps of:

(A) depositing a first dielectric layer on said substrate;

(B) patterning said first dielectric layer to form a patterned first dielectric layer having a first opening;

(C) filling said first opening with a conductive plug;

(D) depositing a second dielectric layer over said patterned first dielectric layer and said conductive plug;

(E) patterning said second dielectric layer to form a patterned second dielectric layer having said interconnect, wherein part of said interconnect lies over at least part of said conductive plug, wherein at least the upper portion of said first dielectric layer has a lower etch rate than said second dielectric layer such that said first dielectric layer acts as an etch stop, and wherein said first dielectric layer comprises a lower layer comprising silicon dioxide and an upper layer comprising silicon nitride, said second dielectric layer comprises silicon dioxide, and wherein said step of patterning said second dielectric layer comprises the steps of:

(E1) forming a patterned photoresist layer on said second dielectric layer, said patterned photoresist layer exposing a portion of said second dielectric layer;

(E2) etching said exposed portion of said second dielectric layer; and (E3) removing said patterned photoresist layer;

(F) forming a barrier layer within said interconnect; and (G) forming a conductive layer over said barrier layer, wherein said barrier layer is a barrier to diffusion of said conductive layer.

5. The method as described in claim 1 wherein said first dielectric layer comprises a lower layer comprising silicon dioxide and an upper layer comprising silicon nitride, said second dielectric layer comprises silicon dioxide, and wherein said step of patterning said second dielectric layer comprises the steps of:

forming a patterned photoresist layer on said second dielectric layer, said patterned photoresist layer exposing a portion of said second dielectric layer;

etching said exposed portion of said second dielectric layer; and removing said patterned photoresist layer.

6. A method of forming an interconnect on a semiconductor substrate comprising the steps of:

depositing a first dielectric layer on said substrate;

patterning said first dielectric layer to form a first dielectric layer having a first opening;

filling said first opening with a conductive material;

depositing a second dielectric layer on said first dielectric layer and said conductive material, wherein at least the upper portion of said first dielectric layer has a lower etch rate than said second dielectric layer;

patterning said second dielectric layer to form a patterned second dielectric layer having an interconnect channel, at least a portion of said interconnect channel overlying at least a portion of said conductive material;

depositing an interconnect layer by depositing a barrier layer over said patterned second dielectric layer and within said interconnect channel, and depositing a metal layer over said barrier layer, wherein said barrier layer is a barrier to diffusion of said metal layer; and polishing said substrate with a polishing solution to remove that portion of said interconnect layer that lies on said patterned second dielectric layer to form said interconnect within said interconnect channel.

7. The method of claim 6, wherein said second dielectric layer comprises a material selected from the group consisting of silicon dioxide, silicon nitride, silicon oxynitride, fluoropolymer, parylene, and polyimide, wherein said metal layer comprises a material selected from the group consisting of aluminum, aluminum alloy, copper, gold, silver, tungsten, and molybdenum, and wherein said polishing solution comprises ammonium hydroxide and has a pH in a range of 9–13 and said polishing continues until the surface of said substrate is substantially planar.

8. The method of claim 6 further comprising the steps of:

removing said second dielectric layer after said step of polishing said substrate; and depositing a diffusion barrier layer over said interconnect.

9. The method of claim 8, wherein said diffusion barrier layer comprises a material selected from the group consisting of silicon nitride, silicon oxynitride, tantalum, titanium nitride, niobium, and molybdenum.

10. A method of forming an interconnect on a semiconductor substrate comprising the steps of:

depositing a first dielectric layer over said substrate;

patterning said first dielectric layer to form a patterned first dielectric layer having a first opening;

filling said first opening with a conductive plug;

depositing a second dielectric layer over said patterned first dielectric layer and said conductive plug;

patterning said second dielectric layer to form a patterned second dielectric layer having an interconnect channel;

depositing a barrier layer over said patterned second dielectric layer and within said interconnect channel;

depositing a conductive layer over said barrier layer, wherein said barrier layer is a barrier to diffusion of said conductive layer;

polishing said substrate with a polishing solution to remove that portion of said barrier and conductive layers that lies on said patterned second dielectric layer to form said interconnect within said interconnect channel; and depositing a diffusion barrier layer over said interconnect, said conductive layer being encapsulated by said barrier layer and said diffusion barrier layer.

11. The method of claim 9, wherein said first dielectric layer comprises silicon nitride and all of said interconnect lies on at least part of said conductive plug and at least part of said first dielectric layer.

12. The method of claim 10, wherein said first dielectric layer comprises a material selected from the group consisting of silicon dioxide, silicon nitride, silicon oxynitride, fluoropolymer, parylene, and polyimide, wherein said first opening is a type selected from the group consisting of a contact opening and a via opening, said conductive plug is a type selected from the group consisting of a contact plug and a via plug, and said conductive plug comprises a material selected from the group consisting of tungsten, tantalum, titanium nitride, molybdenum, silicide, and polysilicon, wherein said second dielectric layer comprises a material selected from the group consisting of silicon dioxide, silicon nitride, silicon oxynitride, fluoropolymer, parylene, and polyimide, wherein said barrier layer comprises a material selected from the group consisting of tungsten, tantalum, titanium nitride, niobium, and molybdenum, wherein said conductive layer comprises a material selected from the group consisting of aluminum, aluminum alloy, copper, gold, silver, tungsten, and molybdenum, and wherein said polishing solution comprises ammonium hydroxide and has a pH in the range of 9–13 and the polishing continues until the surface of said substrate is substantially planar.

13. A method of forming an interconnect on a semiconductor substrate comprising the steps of:

depositing a silicon nitride layer on said substrate;

patterning said silicon nitride layer to form a patterned silicon nitride layer having a first opening;

filling said fast opening with a conductive plug;

depositing a dielectric layer over said patterned silicon nitride layer and said conductive plug;

patterning said dielectric layer to form a patterned dielectric layer having an interconnect channel such that at least part of said interconnect channel lies over at least part of said conductive plug;

depositing an interconnect layer over said patterned dielectric layer and within said interconnect channel;

patterning said interconnect layer to form said interconnect such that said interconnect lies on at least part of said conductive plug and part of said patterned silicon nitride layer;

removing said patterned dielectric layer after said step of patterning said interconnect layer; and depositing a diffusion barrier layer over said interconnect, said interconnect being encapsulated by said patterned silicon nitride layer, said conductive plug, and said diffusion barrier layer.

14. The method of claim 13, herein said dielectric layer comprises a material selected from the group consisting of silicon dioxide, silicon nitride, silicon oxynitride, fluoropolymer, parylene, and polyimide, wherein said first opening is a type selected from the group consisting of a contact opening and a via opening, said conductive plug is a type selected from the group consisting of a contact plug and a via plug, and said conductive plug comprises a material selected from the group consisting of tungsten, tantalum, titanium nitride, molybdenum, silicide, and polysilicon, and wherein said interconnect layer comprises a material selected from the group consisting of aluminum, aluminum alloy, copper, gold, silver, tungsten and molybdenum.

15. The method of claim 14, wherein said diffusion barrier layer comprises a material selected from the group consisting of silicon nitride, silicon oxynitride, tantalum, titanium nitride, and molybdenum.

16. A method of forming an interconnect on a semiconductor substrate comprising the steps of:

depositing a silicon nitride layer on said substrate;

patterning said silicon nitride layer to form a patterned silicon nitride layer having a first opening;

filling said first opening with a conductive plug;

depositing a dielectric layer over said patterned silicon nitride layer and said conductive plug;

patterning said dielectric layer to form a patterned dielectric layer having an interconnect channel such that at least part of said interconnect channel lies over at least part of said conductive plug;

depositing an interconnect layer over said patterned dielectric layer and within said interconnect channel; and patterning said interconnect layer to form said interconnect such that said interconnect lies on at least part of said conductive plug and part of said patterned silicon nitride layer, wherein said step of depositing said interconnect layer comprises the steps of:

depositing a barrier layer over said patterned dielectric layer and within said interconnect channel; and depositing a metal layer over said barrier layer.

17. The method of claim 16 further comprising the step of depositing a diffusion barrier layer over said patterned dielectric layer and said interconnect, said metal layer being encapsulated by said barrier layer and said diffusion barrier layer.

18. The method of claim 17, wherein said barrier layer comprises a material selected from the group consisting of tungsten, tantalum, titanium nitride, niobium, and molybdenum, wherein said metal layer comprises a material selected from the group consisting of aluminum, aluminum alloy, copper, gold, silver, tungsten and molybdenum, and wherein said diffusion barrier layer comprises a material selected from the group consisting of silicon nitride, silicon oxynitride, tantalum, titanium nitride, niobium, and molybdenum.

19. The method as described in claim 4 wherein said conductive layer comprises copper.

20. The method as described in claim 19 wherein said barrier layer comprises titanium nitride.

21. The method as described in claim 6 wherein said second dielectric layer comprises silicon dioxide and said metal layer comprises copper.

22. The method as described in claim 21 wherein said barrier layer comprises titanium nitride.

* * * * *

UNITED STATES PATENT AND TRADEMARK OFFICE
CERTIFICATE OF CORRECTION

PATENT NO. : 5,612,254
DATED : March 18 1997
INVENTOR(S) : Mu et al.

It is certified that error appears in the above-identified patent and that said Letters Patent is hereby corrected as shown below:

In the Abstract at [57] in line 14 delete "chapel." and insert --channel.--

In the Abstract at [57] in line 18 delete "chapel" and insert --channel--

In column 13 at line 1 delete "claim 9," and insert --claim 10,--

In column 13 at line 58 delete "herein" and insert --wherein--

Signed and Sealed this

Twenty-second Day of July, 1997

Attest:

BRUCE LEHMAN

Attesting Officer

Commissioner of Patents and Trademarks